United States Patent

[11] 3,613,067

[72] Inventor Heinz Haberle
Stuttgart-Bad, Germany
[21] Appl. No. 841,692
[22] Filed July 15, 1969
[45] Patented Oct. 12, 1971
[73] Assignee International Standard Electric Corporation
New York, N.Y.
[32] Priority Sept. 14, 1968
[33] Germany
[31] P 17 62 877.2

[54] ANALOG-TO-DIGITAL CONVERTER WITH INTERMEDIATE FREQUENCY SIGNAL GENERATED BY ANALOG INPUT
8 Claims, 2 Drawing Figs.

[52] U.S. Cl. .......... 340/347 AD, 324/78, 328/138, 340/347 DD
[51] Int. Cl. .......... H03k13/175, G01r 23/02
[50] Field of Search .......... 340/347 AD, 347 DD; 324/79, 80, 81, 120, 78; 328/138

[56] References Cited

UNITED STATES PATENTS 3,445,840 5/1969 Carlstead .......... 340/347
3,079,555 2/1963 Daschke .......... 324/80
3,037,077 5/1962 Williams et al. .......... 340/347 UX
3,007,111 10/1961 Umile et al. .......... 324/80
2,916,700 12/1959 Daschke .......... 324/80

*Primary Examiner*—Thomas A. Robinson
*Assistant Examiner*—Michael K. Wolensky
*Attorneys*—C. Cornell Remsen, Jr., Walter J. Bau, Paul W. Hemminger, Percy P. Lantzy, Philip M. Bolton, Isidore Togut and Charles L. Johnson, Jr.

ABSTRACT: PAM samples are converted to a frequency proportional to the PAM amplitude. The resultant frequencies are applied to $2^n$ resonators each resonant at a different frequency and representing one of $2^n$ code groups. $2^n$ gates, timed by the sampling signal, are each coupled to a voltage node of an associated one of the resonators and logic circuitry coupled to the gates provide the output code group for each sample dependent on the resonator excited. The resonators may be of printed strip line configuration arranged to provide linear or compression coding characteristics. A binary averaging arrangement can be provided to handle situations where the converted frequency excites two or more resonators. A gray-type code is employed to reduce coding errors when two or more resonators are excited.

INVENTOR

HEINZ HÄBERLE

BY Alfred C. Hill

AGENT

PATENTED OCT 12 1971 3,613,067

SHEET 2 OF 2

INVENTOR

HEINZ HÄBERLE

BY Alfred C. Hill

AGENT

ANALOG-TO-DIGITAL CONVERTER WITH INTERMEDIATE FREQUENCY SIGNAL GENERATED BY ANALOG INPUT

BACKGROUND OF THE INVENTION

This invention relates to pulse code modulation (PCM) systems and more particularly to a rapid analog-to-digital converter for employment in time division multiplex PCM systems. For the purpose of converting an analog value into a digital value there are required, in principle, analog laboratory standards. The more standards that are available, the less individual measurements or measuring steps (comparison of the analog value with normal values) that are required. For example, if an analog value is to be represented in a maximum of $2^{10}$=1,024 steps, and when only one laboratory standard is available, there are required 1,024 measuring steps; 10 measuring steps are required when 10 laboratory standards are available; and only one measuring step is required when 1,024 laboratory standards are available. In cases where the coding is to be carried out very rapidly, the coding must be done in as small a number of measuring steps as possible. In that case, however, there is required a great number of laboratory standards. When coding the voltage or current amplitude values, the constant voltage or constant current sources correspond to the laboratory standards. The measuring processes are amplitude comparisons. The circuit-technical expenditure and the expenditure required for achieving the necessary accuracy increases as the number of laboratory standards increases. In addition thereto, in connection with the rapid time-division multiplex coding of pulse amplitude modulation (PAM) values, it is very difficult to meet desired crosstalk requirements.

SUMMARY OF THE INVENTION

An object of the present invention is to provide an analog-to-digital converter with an arbitrary coding characteristic for *n* bits.

Another object of the present invention is to provide a rapid analog-to-digital converter where the circuit-technical expenditure can be kept at a low level.

A feature of the present invention is the provision of an analog-to-digital converter comprising a source of amplitude samples of an analog signal; first means coupled to the source to convert each of the samples to a frequency proportional to the amplitude of each of the samples; $2^n$ resonators each coupled to the first means, each of the resonators having a different resonant frequency and representing a different one of $2^n$ code groups, where $n$ is equal to the number of digits forming a code group; and second means coupled to the resonators responsive to the excitation of at least one of the resonators to produce the code group of the excited resonator.

This converter results in the advantage that for each code value one laboratory standard can be kept ready, and that in this way sufficient time is available for the coding. Moreover, any arbitrary compression coding characteristic can be obtained by suitably selecting the dimensions of the resonators. Likewise, there is also avoided the difficulties arising from the PAM-multichannel coding.

Another feature of this invention resides in the fact that there is used a Gray-type code. From this there results the advantage that there will not be any error in the conversion if, in the case of a frequency value lying between two resonant values, that is two neighboring resonators provide a criterion for a voltage node. When combining the two digital values, there will be obtained a digital value corresponding to one of the two values.

Still another feature of the invention resides in the fact that there is provided an arrangement for effecting the digital mean-value formation at the output of two or more resonators that respond to one frequency. The gating circuits which are controlled by the integrated voltages, may then be designed in such a way that several neighboring gating circuits will open for one frequency value. This allows a reduction in the accuracy requirement and there is also obtained an additional noise suppression.

A further feature of this invention resides in the fact that the resonators are realized in accordance with strip-line techniques, as printed circuits. When preparing the printed circuit, the coding characteristic may be chosen at will, and is then always reproducible.

BRIEF DESCRIPTION OF THE DRAWING

The above-mentioned and other features and objects of this invention will become more apparent by reference to the following description taken in conjunction with the accompanying drawings, in which.

DESCRIPTION OF THE PREFERRED EMBODIMENTS

Figure 1:
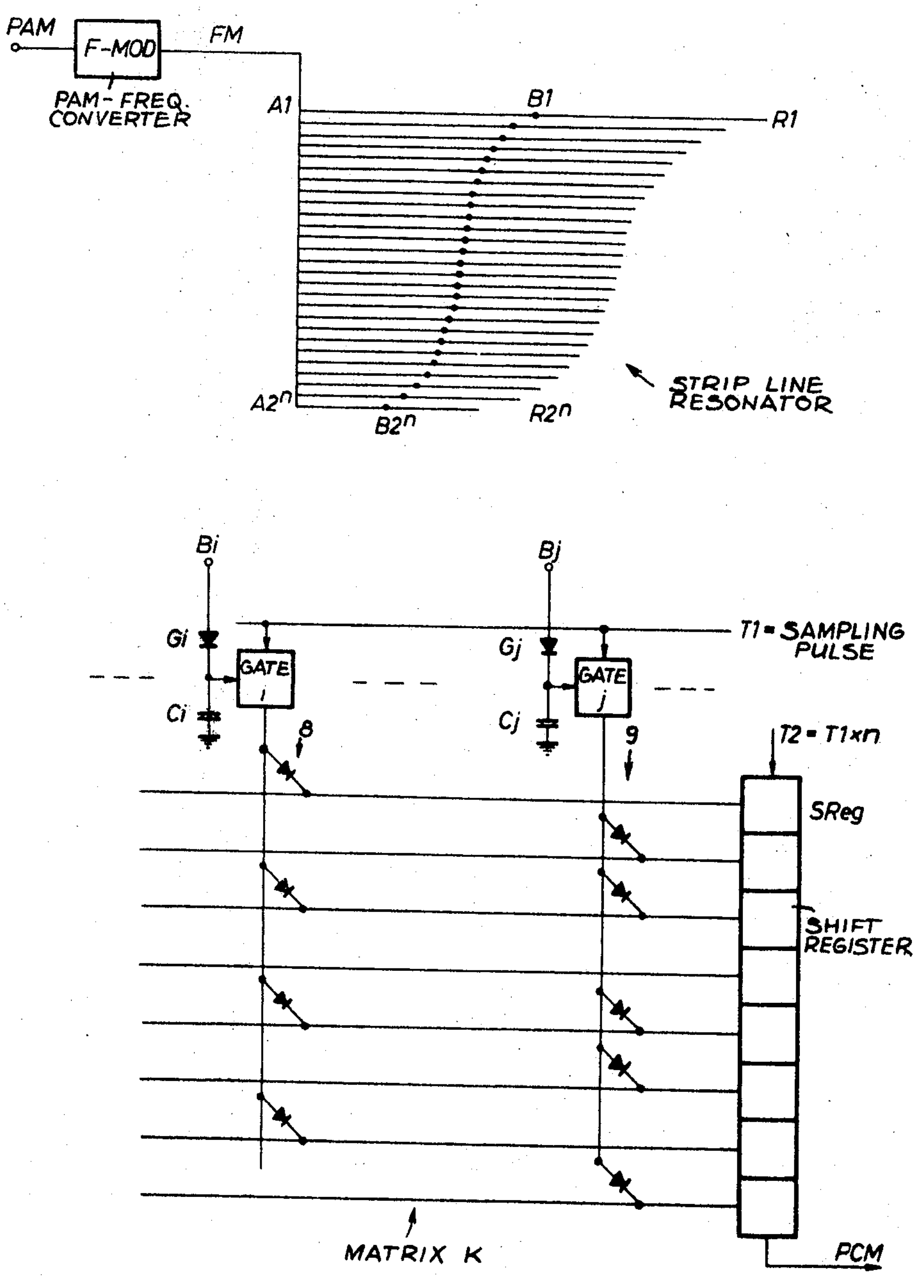
FIG. 1 is a block diagram of the analog-to-digital converter in accordance with the principles of this invention.

Referring to FIG. 1, the analog signals are scanned or sampled in the manner known per se and are applied as a time-division multiplex pulse train of PAM values to the input of the coder (analog-to-digital converter). These PAM-amplitude values are converted in a PAM-Frequency converter, F-MOD, such as a voltage controlled oscillator, into a frequency FM which is proportional to the amplitude of the PAM sample. In this way a predetermined frequency is assigned to each amplitude sample value in an unambiguous fashion. This frequency is applied to principle elements of this coder. When employing an $n$-bit coding, this coder consists of $2^n$ resonators R1...R$2^n$ of different lengths, with the arrangement thereof being shown in FIG. 1. The resonators may be designed as strip lines in a printed circuit fashion, and are, thus, very well suited for being manufactured in mass production.

In this form they may be referred to as a "harp." The "envelope curve" of these resonators is the compression coding characteristic and, in the graphical design of the "harp," may be chosen at will in a printed circuit configuration. Appropriately, decoupling transistors are arranged at points A1...A$2^n$, in order to avoid reactions between the individual resonators. These transistors may be manufactured in accordance with the thin-film, or any other, technique.

When suitably selecting the frequencies from the frequency modulator F-MOD, and the lengths of the resonators R1...R$2^n$, a standing wave will be present in at least one resonator for each frequency in the associated frequency band of the output of modulator F-MOD. (For the frequency of 1Gc/s, the associated resonator, depending on the base material, has a length of about 10 to 15 cm). When numbering the resonators from 1 to $2^n$, then the respective number of the resonator in which a standing wave has formed will represent in digital notation, the code value for the PAM value.

The recognition of the standing waves in the resonators may be effected in different ways. In FIG. 1 it is shown that the coupling to the points of the voltage nodes B1...B$2^n$ of the resonators is provided by diodes G. For the sake of simplicity, there is only shown the decoupling with respect to two resonators. The points B$i$ and B$j$ represent the coupling points of the two resonators R$i$ and R$j$. The voltage as appearing at decoupling point B$i$ is applied via diode rectifier G$i$ to capacitor C$i$. This capacitor serves to integrate the voltage passed by diode G$i$. All of the capacitors then have a finite voltage values, and no voltage is across the capacitor C$j$ which is associated with the resonator R$j$ having the standing wave. When these $2^n$ voltages of the capacitors C$i$ are applied to $2^n$ gate circuits $i$ as a blocking potential, then only the gate circuit $j$ is not blocked, because a standing wave has formed in the associated resonator R$j$, and because a zero voltage is present at the coupling point B$j$. To all gate circuits, a train of sampling pulses T1 is applied. Passage of a pulse is only permitted via the gate circuit $j$, for controlling, via matrix K, the parallel feeding of the number of the gate circuit in digital notation, into shift register SReg, from which the information is then read out in a serial form as the PCM-value, controlled by a pulse sequence $T^2$ with the frequency thereof corresponding to $n$-times that of the sampling frequency of pulses T1. Depending upon the pulses contained in the pulse sequence T1 there is also effected, in a manner not shown, the discharge of the capacitors C*i*. The digital number of the activated gate and, hence, excited resonator is actually provided by the presence and absence of a diode connection between the vertical input and horizontal outputs of matrix K. For instance, if diodes 8 represent a "1" then the code group represented by the activation of resonator Ris 10101010 and if diodes 9 also represent a "1" then the code group represented by the activation of resonator R*j* is 01101101. It should be noted that the diode of the matrix could represent a "0" and no connection between vertical and horizontal lines of the matrix could represent a "1." It all depends on the organization of the matrix and the gate circuits.

If one frequency is lying between the resonant frequencies of neighboring resonators, then finite, but very small output voltages will result at the capacitors. By correspondingly selecting the thresholds in the gating circuits, two gating circuits will remain open, and with one pulse T1 the numbers of two neighboring resonators are recorded in shift register SReg. In order to avoid errors that will result therefrom, it is advisable to use the Gray-type code, in which from one code value to the next one there is only one position change. Accordingly, in the shift register, and in spite of the dual control, there is always stored the number of one of the two open gating circuits.

Figure 2:
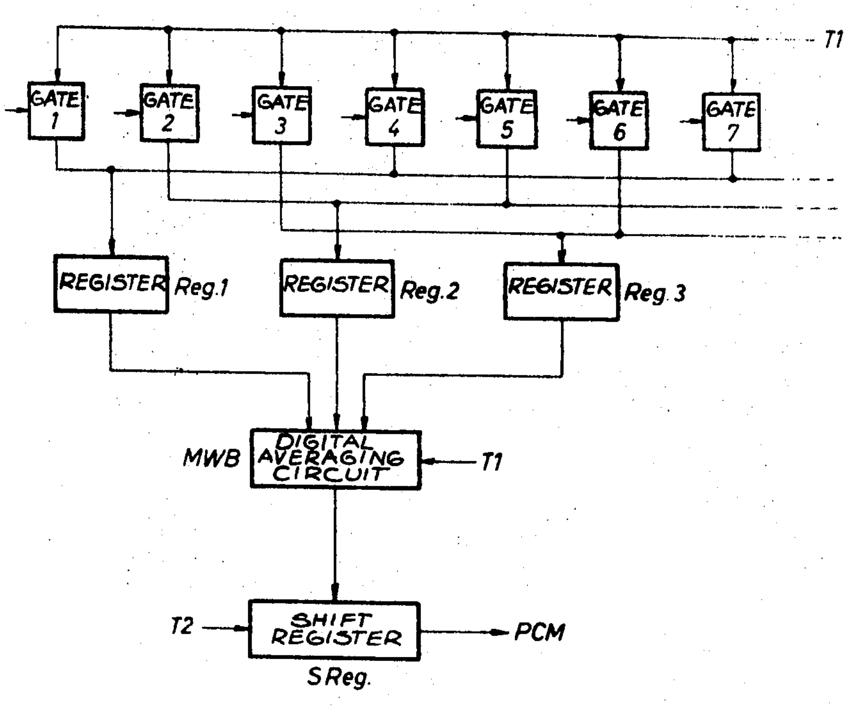
FIG. 2 is a block diagram of a modification to a portion of FIG. 1.

When designing the gating circuits in such a way that for one frequency value several neighboring gate circuits simultaneous (not only a maximum of two, as described hereinbefore) shall remain open, there must be provided an arrangement to take a digital average or mean value. FIG. 2 shows a modification to the arrangement of FIG. 1 relating to the case where a maximum of three neighboring gate circuits are to remain open. In this case there are now provided three registers Reg1 to Reg3 in which there are recorded separately the digital numbers of the neighboring gate circuits by means of appropriately configured matrix like matrix K of FIG. 1. To this end, the register Reg1 is connected to the gate circuits, 1, 4, 7..., the register Reg2 to the gate circuits 2, 5, 8..., and the register Reg3 to the gate circuits 3,6, 9... . When three neighboring gate circuits remain open, one register for each is always available. If a greater number of simultaneously opened gate circuits is possible, or else also for safety reasons, the number of registers and, consequently, the groups of gate circuits may be enlarged.

From the digital values as stored in registers Reg1 to Reg3 there is then, with the aid of conventional measures, effected the taking of the digital mean or average value in the digital averaging circuit MWB and, likewise at the frequency of the sampling pulse T1, this digital mean or average value is transferred to shift register SReg.

While I have described above the principles of my invention in connection with specific apparatus, it is to be clearly understood that this description is made only by way of example.

I claim:

1. An analog-to-digital converter comprising:
a source of amplitude samples of an analog signal;
first means coupled to said source to convert each of said samples to a frequency proportional to the amplitude of each of said samples;
$2^n$ resonators each coupled to said first means, each of said resonators having a different resonant frequency and representing a different one of $2^n$ code groups, where $n$ is equal to the number of digits forming a code group; and
second means coupled to said resonators responsive to the excitation of at least one of said resonators to produce said code groups of said excited resonator;
said second means including
a source of sampling pulses,
a circuit for each of said resonators including
rectifier means coupled to its associated one of said resonators,
integrator means coupled to said rectifier means, and
gate means coupled to said integrator means and said source of sampling pulses, and
matrix means coupled to each of said gate means to produce said code group of said excited resonator in parallel form.

2. A converter according to claim 1, wherein
each of said resonators are of the strip line type configured to provide a linear coding characteristic, 3. A converter according to claim 1, wherein
each of said resonators are of the strip line type configured to provide a compression coding characteristic.

4. A converter according to claim 1, wherein
rectifier means is coupled to a node point on each of said resonators.

5. A converter according to claim 1, wherein
said second means further includes
parallel-to-serial converter means coupled to said matrix means to provide said code group of said excited resonator in serial form.

6. A converter according to claim 1, wherein said converter produces code groups according to a Gray-type code.

7. An analog-to-digital converter comprising:
a source of amplitude samples of an analog signal;
first means coupled to said source to convert each of said samples to a frequency proportional to the amplitude of each said samples;
$2^n$ resonators each coupled to said first means, each of said resonators having a different resonant frequency and representing a different one of $2^n$ code groups, where $n$ is equal to the number of digits forming a code group; and
second means coupled to said resonators responsive to the excitation of at least one of said resonators to produce said code group of said excited resonator;
wherein
more than one of said resonators is excited by the frequency signal output of said first means; and
said second means includes
an arrangement to provide at the output thereof the digital average of the code groups represented by said excited resonators.

8. An analog-to-digital converter comprising:
a source of amplitude samples of an analog signal;
first means coupled to said source to convert each of said samples to a frequency proportional to the amplitude of each of said samples; p1 $2^n$ resonators each coupled to said first means, each of said resonators having a different resonant frequency and representing a different one of $2^n$ code groups, where $n$ is equal to the number of digits forming a code group; and
second means coupled to said resonators responsive to the excitation of at least one of said resonators to produce said code group of said excited resonator;
said converter producing code groups according to a Gray-type code; and
said second means including
a source of sampling pulses,
a circuit for each of said resonators including
a diode rectifier coupled to a node of its associated one of said resonators,
a capacitor coupled between said rectifier and ground, and
a gate coupled to the junction of said rectifier and said capacitor and said source of sampling pulses,
a diode matrix coupled to each of said gates to produce said code group of said excited resonator in parallel form, and
a shift register coupled to said matrix to provide said code group of said excited resonator in serial form.